United States Patent
Jeong et al.

(10) Patent No.: US 7,072,214 B2
(45) Date of Patent: Jul. 4, 2006

(54) NOR FLASH MEMORY DEVICE AND METHOD OF SHORTENING A PROGRAM TIME

(75) Inventors: Jae-Yong Jeong, Gyeonggi-do (KR); Heung-Soo Lim, Gyeonggi-do (KR)

(73) Assignee: Samsung Electronis Co., Ltd., Suwon-si (KR)

( * ) Notice: Subject to any disclaimer, the term of this patent is extended or adjusted under 35 U.S.C. 154(b) by 0 days.

(21) Appl. No.: 10/957,182

(22) Filed: Sep. 30, 2004

(65) Prior Publication Data

US 2005/0226049 A1    Oct. 13, 2005

(30) Foreign Application Priority Data

Apr. 9, 2004    (KR) ............... 10-2004-0024600

(51) Int. Cl.
*G11C 16/04*    (2006.01)

(52) U.S. Cl. .................. 365/185.11; 365/185.17; 365/185.33

(58) Field of Classification Search ........... 365/185.11, 365/185.17, 185.18, 185.23, 185.25, 185.29, 365/185.33
See application file for complete search history.

(56) References Cited

U.S. PATENT DOCUMENTS

| | | | | |
|---|---|---|---|---|
| 6,208,561 B1 * | 3/2001 | Le et al. | ............... | 365/185.23 |
| 6,297,993 B1 * | 10/2001 | Chen et al. | ............ | 365/185.33 |
| 6,463,516 B1 * | 10/2002 | Leong et al. | ........... | 365/185.33 |
| 6,483,748 B1 * | 11/2002 | Futatsuya et al. | ...... | 365/185.11 |
| 6,510,085 B1 * | 1/2003 | Fastow et al. | ......... | 365/185.33 |
| 6,654,290 B1 * | 11/2003 | Lee et al. | .............. | 365/185.11 |
| 6,944,059 B1 * | 9/2005 | Macerola | ............... | 365/185.25 |

* cited by examiner

*Primary Examiner*—Trong Phan
(74) *Attorney, Agent, or Firm*—Marger Johnson & McCollom, P.C.

(57) ABSTRACT

A NOR flash memory device is capable of shortening a program time. Included is a cell array segmented into a plurality of banks, a data input buffer to receive and store data composed of units of words, the number of units corresponding to the number of banks, and a program driver to apply a program voltage contemporaneously to the banks. According to the present invention, a plurality of program data composed of word units is programmed at the same time, so that the time for programming the whole memory cell array can be shortened.

26 Claims, 5 Drawing Sheets

NOR FLASH MEMORY DEVICE AND METHOD OF SHORTENING A PROGRAM TIME

CROSS-REFERENCE TO RELATED APPLICATIONS

This U.S. non-provisional patent application claims priority under 35 U.S.C. § 119 of Korean Patent Application 2004-24600 filed on Apr. 9, 2004, the entire contents of which are hereby incorporated by reference.

BACKGROUND OF THE INVENTION

The present invention is relevant to NOR flash memory devices, in particular to programming data into the NOR flash memory devices.

Flash memory devices are usually classified into NAND and NOR types. The NAND flash memory device has a structure of strings, in which a plurality of memory cells is connected from a single bitline in series. On the other side, the NOR flash memory device is constructed of a plurality of memory cells connected to a single bitline in parallel.

Figure 1:
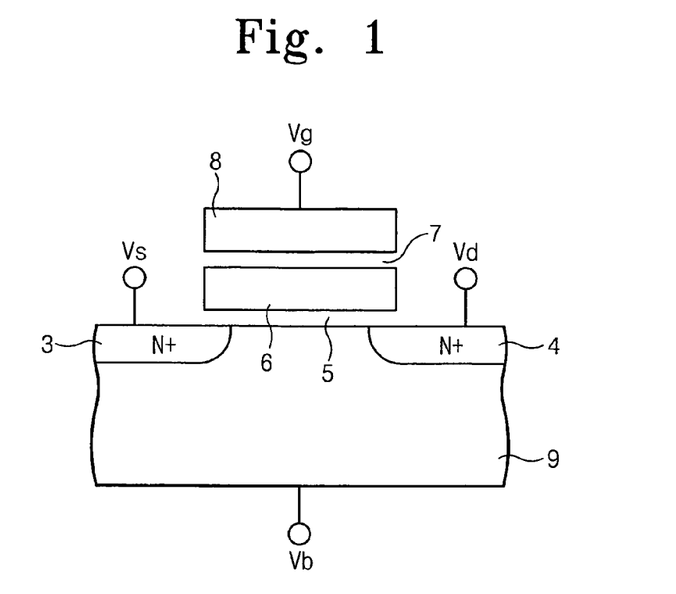
FIG. 1 is a sectional diagram of a memory cell employed in a flash memory device.

FIG. 1 shows a section of a memory cell employed in a flash memory device. As illustrated in FIG.1, a flash memory cell is composed of a source region 3 and a drain region 4 that are formed in a P-type substrate 9, a floating gate 6 formed over a channel region with an interposing thin insulation film 5 less than 100 Å therebetween, and a control gate 8 formed over the floating gate 6 with an interposing insulation film (an ONO film) 7. In FIG. 1, the source region 3, the drain region 4, the control gate 8, and the substrate 9 are connected to voltages Vs, Vd, Vg, and Vb, respectively.

Figure 2:
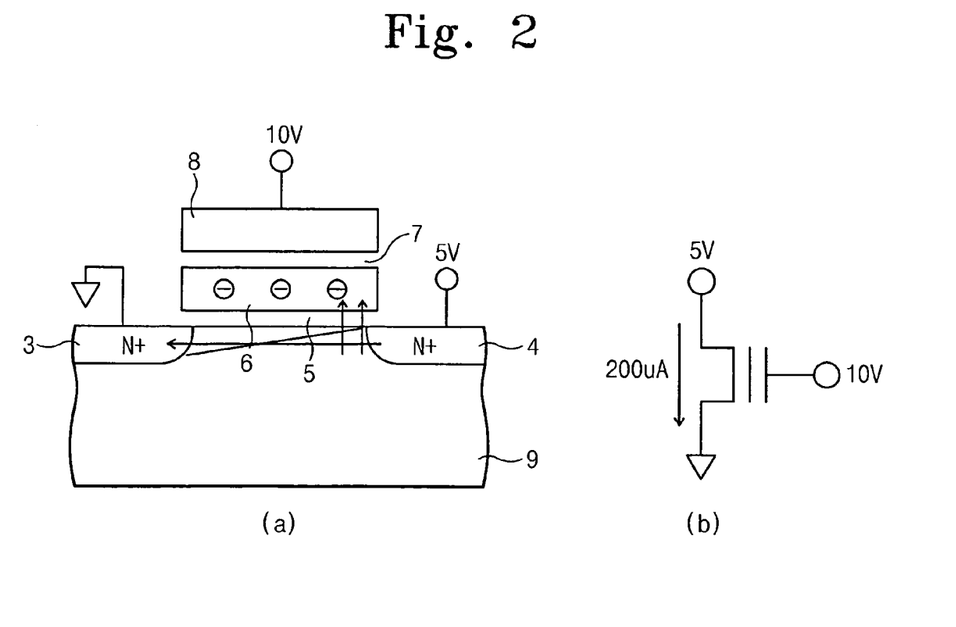
FIG. 2 is a sectional schematic illustrating a cell bias condition in programming a memory cell of a NOR flash memory device.

FIG. 2 illustrates a cell bias condition in programming a memory cell of a NOR flash memory device. In a program operation, the source region 3 and the substrate 9 are grounded. The control gate 8 is connected to a high voltage of about 10V, while the drain region 4 is connected to a voltage of about 5V. With this bias condition, electrons are injected into the floating gate 6 from a channel region adjacent to the drain region 4 as shown in FIG. 2A. Such a mechanism, called channel hot electron injection, programs a memory cell in a different way from the method of F-N (Fouler-Nordheim) tunneling. By the program operation, the floating gate 6 is set to a negative potential, which acts to increase the threshold voltage of the memory cell during a read operation. A memory cell with this state is referred to as "off cell".

Generally, as illustrated in FIG. 2B, when a voltage of about 5V is applied to the drain region 4 of a memory cell during a program operation, a cell current of about 200 µA flows from the drain region 4 towards the grounded source region 3 by way of the channel region. For instance, simultaneously programming data bits of a unit byte/word requires a current of 1.6 mA (200 µA×8) maximum for the unit byte, while a current of 3.2 mA (200 µA×16) maximum for the unit word.

As such, the NOR flash memory device needs to supply a cell current flowing through a memory cell and a voltage of about 5V to a bitline during a program operation. For this purpose, the NOR flash memory device usually employs an internal charge pump circuit. However, it is inevitable to have a limit in the number of bits programmable in a given time because such a charge pump circuit occupies a large circuit area.

Generally, the NOR flash memory device is programmed in units of bytes (8 bits) or words (16 bits). It is required to shorten the program time per unit byte or unit word when a multiplicity of NOR flash memory devices is necessary to be programmed with predetermined data (e.g., system operation codes). Further, according to trends, increased memory capacity leads to an overall increase of time to program the entire memory cells. Thus a reduction of program time will be more important as an actual factor in improving operational performance.

SUMMARY OF THE INVENTION

The present invention is directed to a NOR flash memory device and method of programming in a shorter time, as well as a system employing such a NOR flash memory device.

A plurality of program data composed of word units is programmed at the same time, so that the time for programming the whole memory cell array can be shortened.

An aspect of the present invention is to provide a NOR flash memory device comprising: a cell array including banks each composed of sectors, each sector being constructed of memory cells coupled to wordlines and bitlines; a row selector for designating one of the wordlines in each bank in response to a row address; a column selector for designating a predetermined number of bitlines in each bank in response to a column address; a data input buffer for receiving and holding program data bits in units of the predetermined number or less; and a program driver for contemporaneously applying a program voltage to the selected bitlines in response to the program data bits held in the data input buffer.

In this embodiment, the data input buffer is comprised of unit buffers each assigned to the banks. Each unit buffer receives the predetermined number of program data bits in parallel.

In this embodiment, the program driver is supplied with a high voltage over a power source voltage from the external to generate the program voltage.

In this embodiment, the device is further comprised of a fail detector for comparing data bits of the cell array with the program data bits of the data input buffer.

The present invention also provides a system comprising: a host for generating data bits in units of a predetermined number in a predetermined number of times or less; and a NOR flash memory device operable in a program mode with the data supplied from the host. The device of this embodiment comprises: a cell array including banks disposed in correspondence with the predetermined number of times, each bank being composed of sectors, each sector being constructed of memory cells coupled to wordlines and bitlines; a row selector for designating one of the wordlines in each bank in response to a row address; a column selector for designating bitlines in the predetermined number in each bank in response to a column address; a data input buffer for receiving and holding the data bits of the predetermined number in the predetermined number of times or less; and a program driver for contemporaneously applying a program voltage to the selected bitlines in response to the data bits held in the data input buffer.

In this embodiment, the program driver is supplied with a high voltage greater than a power source voltage from the host.

The present invention also provides a method of programming a NOR flash memory device including a cell array with n number of banks each composed of sectors each of which is constructed of memory cells coupled to wordlines and bitlines, a row selector for designating one of the wordlines in each bank in response to a row address, and a column selector for designating i number of bitlines in each bank in response to a column address, the method comprising the steps of; (a) receiving a command to enable a program operation for i data bits at the same time; (b) receiving addresses to designate locations to store the data bits; (c) receiving and temporarily holding the i data bits in n times or less, corresponding to the selected bitlines; and (d) simultaneously applying a program voltage to the selected bitlines in response to the data bits held in the step (c).

In this method, prior to the step (a), the entire program data is segmented into n bank units and then the i data bits is supplied in n times or less.

In this method, a further step (e) is provided to compare data bits of the cell array with the data bits of the data input buffer and detecting a fail of programming.

In this method, it repeats the steps (d) and (e) until the data bits of the memory cell array are identical to the data bits held in the step (c).

BRIEF DESCRIPTION OF THE DRAWINGS

The accompanying drawings are included to provide a further understanding of the invention, and are incorporated in, and constitute a part of, this specification. The drawings illustrate example embodiments of the present invention and, together with the description, serve to explain principles of the present invention. In the drawings.

DESCRIPTION OF THE PREFERRED EMBODIMENT

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 3:
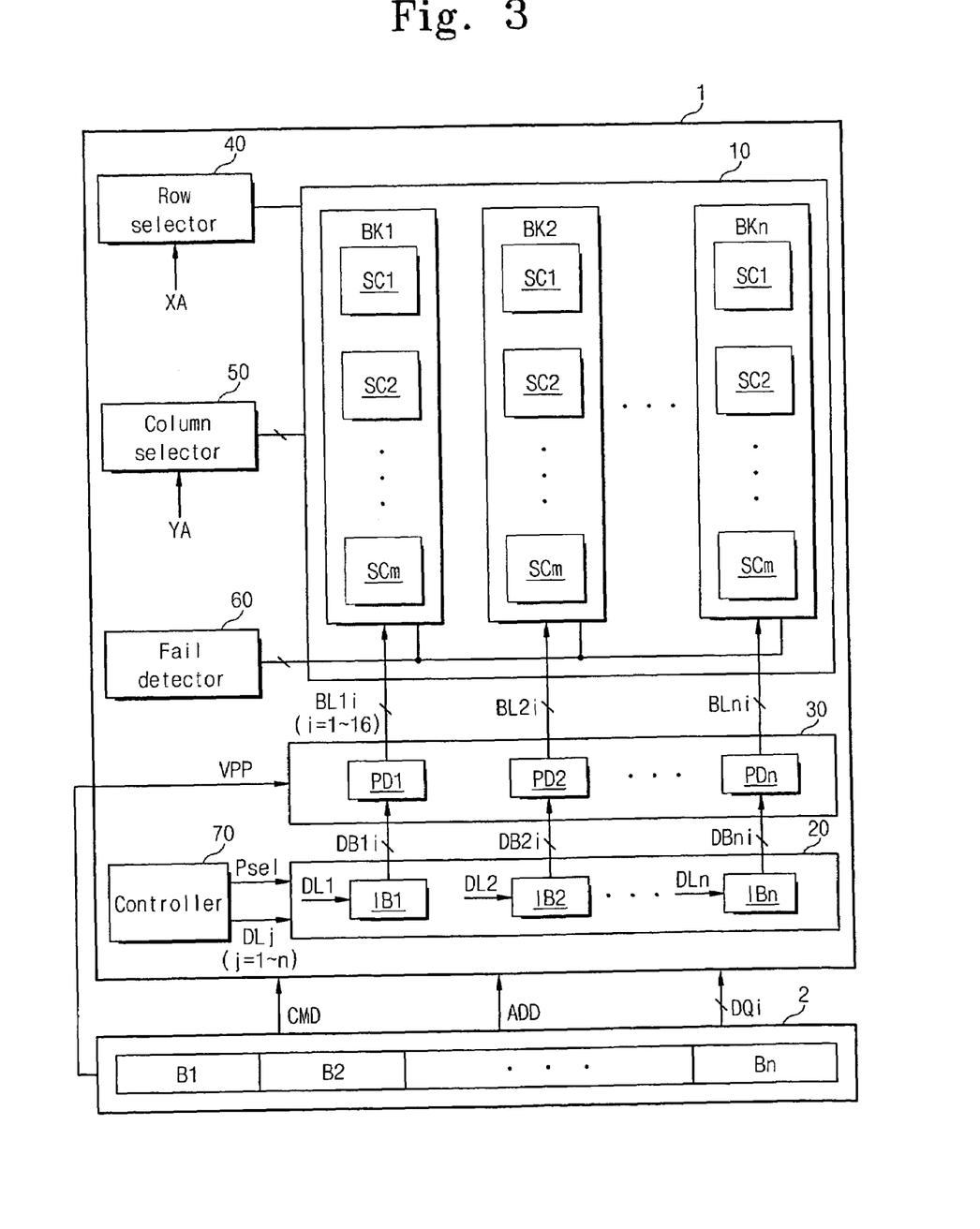
FIG. 3 is a block diagram illustrating an embodiment of a NOR flash memory device in accordance with the present invention.

FIG. 3 is a block diagram illustrating an embodiment of a NOR flash memory device in accordance with the present invention. Referring to FIG. 3, the NOR flash memory device 1 according to the invention is comprised of a cell array 10, a row selector 40, and a column selector 50.

The cell array 10 is composed of a plurality of banks BK1~BKn. Each bank is composed of a plurality of sectors SC1~SCm each as a unit of erasing. Each sector is constructed of a plurality of memory cells (not shown) coupled to a plurality of wordlines and bitlines. Output lines and output circuitry are not shown in FIG. 3 so that the overall NOR flash memory device 1 is simply and clearly illustrated. FIG. 3, in conjunction with FIG. 4, which shows one of the plurality of banks and its sectors in greater detail than in FIG. 3, will enable one skilled in the art to fully understand the output circuitry needed for the operation of the NOR flash memory device 1.

The row selector 40 selects one wordline in response to a row address XA. The column selector 50 selects 16 bitlines for every bank in response to a column address YA. The structures and operations regarding the cell array 10, the row selector 40, and the column selector 50 will be described with reference to FIG. 4 in detail.

The NOR flash memory device 1 also includes a data input buffer 20, a program driver 30, and a controller 70.

The data input buffer 20 receives program data of 16 bits in parallel, equal to the number of banks. The program data is stored in unit buffers IB1~IBn of the input buffer 20 in units of 16 bits.

The unit buffers IB1~IBn are alternatively operable under the control of data latch signals DLj (j=1~n). For instance, if DL1 is a high level, the first unit buffer IB1 receives 16 data bits in parallel. The receiver data is held in the first unit buffer IB1 for a time. The data input buffer 20 dumps data held in the unit buffers IB1~IBn contemporaneously to the program driver 30 when the program selection signal PSEL is a high level.

The controller 70 applies the program selection signal PSEL and the data latch signal DLj to the data input buffer 20. The data input buffer 20 may receive the program data in units of 16 bits by the number of the banks or less, alternatively or sequentially, under regulation of the controller 70. The structure and operation regarding the data input buffer 20 will be described in more detail with reference to FIG. 5.

The program driver 30 applies a program voltage contemporaneously to selected bitlines among bitline packets BL1i~BLni (i=1~16) in response to program data packets DB1i~DBni (i=1~16) stored in the data input buffer 20. The program driver 30 is composed of unit drivers PD1~PDn corresponding to the unit buffers IB1~IBn. The program driver 30 is supplied with a high voltage VPP from an external power source that is greater than the (internal) power source voltage. The high voltage VPP from the external source is used for supplying a drain voltage and a cell current of a selected cell transistor in a program operation. Otherwise, it may be possible to supply the high voltage VPP internally by using a charge pump circuit (not shown) embedded in the NOR flash memory device. The structure and operation of the program driver 30 will be described in more detail with reference to FIG. 6.

The NOR flash memory device 1 also includes a fail detector 60. The fail detector senses data stored in the cell array 10 and then detects a failure of programming by comparing the sense data with the program data stored in the data input buffer 20. The fail detector 60 is shared by all the banks of the cell array 10.

As illustrated in FIG. 3, the NOR flash memory device is associated with a host 2 for providing command signals CMD, address signals ADD, data DQi, and the high voltage VPP thereinto. The host 2 provides 16-bit data in n number of times or less, dividing entire data into the bank units B1~Bn.

For example, data stored in the first bank unit B1 is temporarily stored in the first unit buffer IB1 in a unit of 16 bits and finally stored in the first bank BK1 of the cell array 10. The high voltage provided from the host 2 is supplied to the program driver 30 through a power terminal (or pin).

Figure 4:
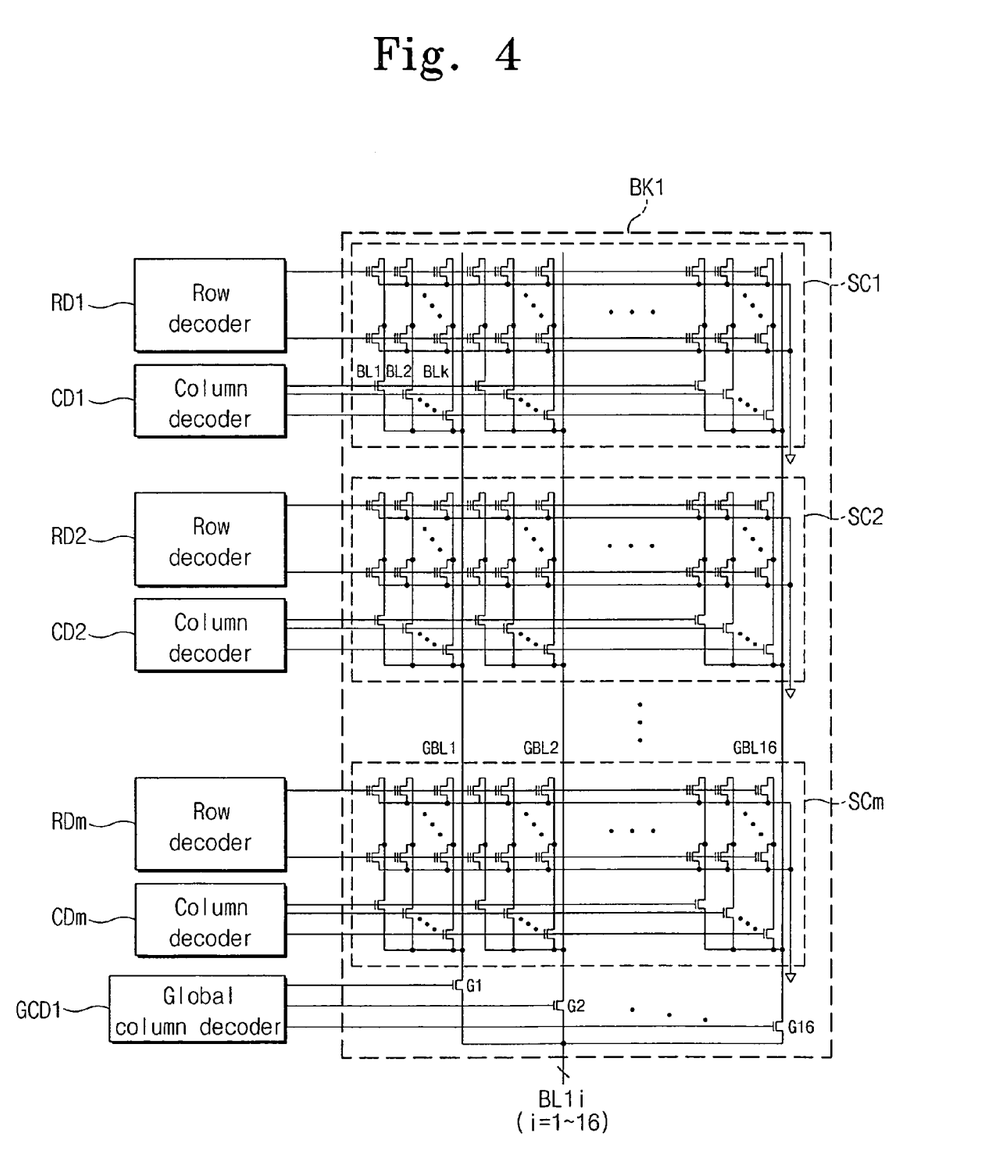
FIG. 4 is a circuit diagram illustrating a bank of a cell array associated with a row and column selector and the peripherals, shown in FIG. 3.

FIG. 4 illustrates a circuit pattern of the first bank BK1 as an example associated with the row and column selectors and the peripherals, shown in FIG. 3. The row selector 40 includes a plurality of row decoders RD1~RDm while the column selector 50 includes a plurality of column decoders CD1~CDm. Pairs of the row and column decoders correspond each to the sectors SC1~SCm. The column selector 50 is further comprised of a global column decoder GCD1 arranged corresponding to the first bank BK1.

Referring to FIG. 4, in the first bank BK1 composed of the plurality of sectors SC1~SCm, each of which forms the erase unit, the first sector SC1 is coupled to the row decoder RD1 for driving a wordline assigned to a selected memory cell and the column decoder for selecting the bitlines BL1~BLk that are assigned to a global bitline (e.g., GBL1). The global bitlines are exemplarily arranged in numbers of 16, so that each of the global bitlines GBL1~GBL16 is linked with the bitlines BL1~BLk (preferably namable as local bitlines relative to the global bitlines) through their corresponding column gate transistors in every sector. The column gate transistors are controlled by the column decoder corresponding thereto. Other sectors are disposed with the same connected feature as the first sector SC1.

The global bitlines GBL1~GBL16 are lead from one (e.g., BL1$i$) of the bitline packets BL1$i$~BLni provided by the program driver 30, each by way of selection transistors G1~G16 controlled by the global column decoder GCD1. As a result, the memory cell array is constructed in a hierarchical architecture with the local bitlines each connected to the memory cells along columns and the global bitlines each connected to a group of the local bitlines.

Figure 5:
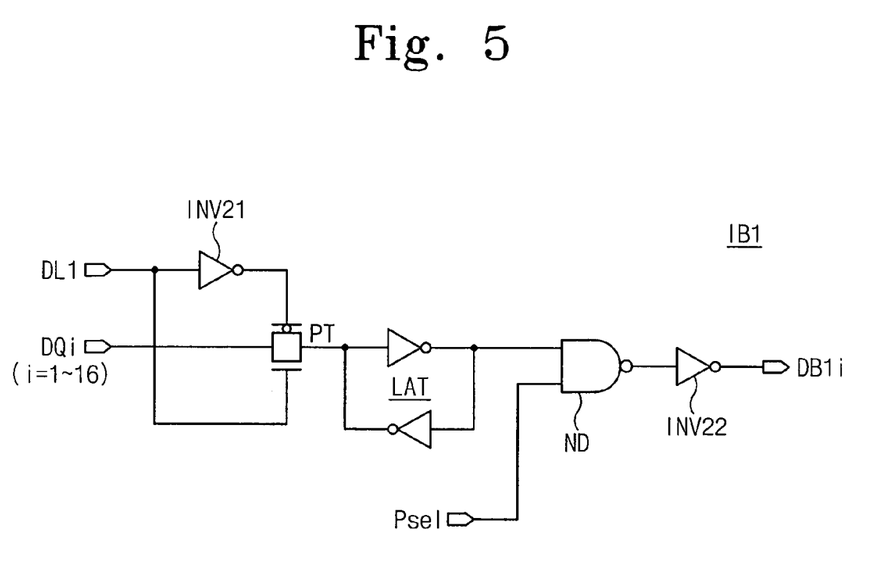
FIG. 5 is a circuit diagram illustrating the data input buffer shown in FIG. 3.

FIG. 5 illustrates an exemplary circuit of the data input buffer 20 shown in FIG. 3. While FIG. 5 discloses the circuit of the first unit buffer IB1 as a representative, all of the n-numbered unit buffers have the same circuit features. Further, it should be understood that FIG. 5 shows a simplified circuit although the unit buffer receives the 16 data bits DQi in parallel and outputs the 16 program data bits DB1$i$ in parallel. Therefore, the unit buffer is composed of 16 units of the circuit shown in FIG. 5, the circuit elements thereof as well.

Now, referring to FIG. 5, the unit buffer IB1 is comprised of pass transistors PT for transferring the 16 data bits DQi to latch circuits LAT in response to the data latch signal DL1 assigned thereto. The data latch signal DL1 is applied to the pass transistors PT via an inverter INV21. When the data latch signal DL1 is a high level, the pass transistors PT transfer the 16 parallel data bits DQi each to the latch circuits LAT. The latch circuits LAT temporarily store the data bits DQi. Outputs of the latch circuit LAT are each applied to NAND gates ND. The NAND gates ND respond each to the outputs of the latch circuits LAT under control of the program selection signal PSEL. Outputs of the NAND gates ND are generated to the program data bits DB1$i$ each through inverters INV22. For example, when the data latch signal DL1 and the program selection signal PSEL are all high levels, DQi="1" makes DB1$i$="0" while DQi="0" makes DB1$i$="1".

Figure 6:
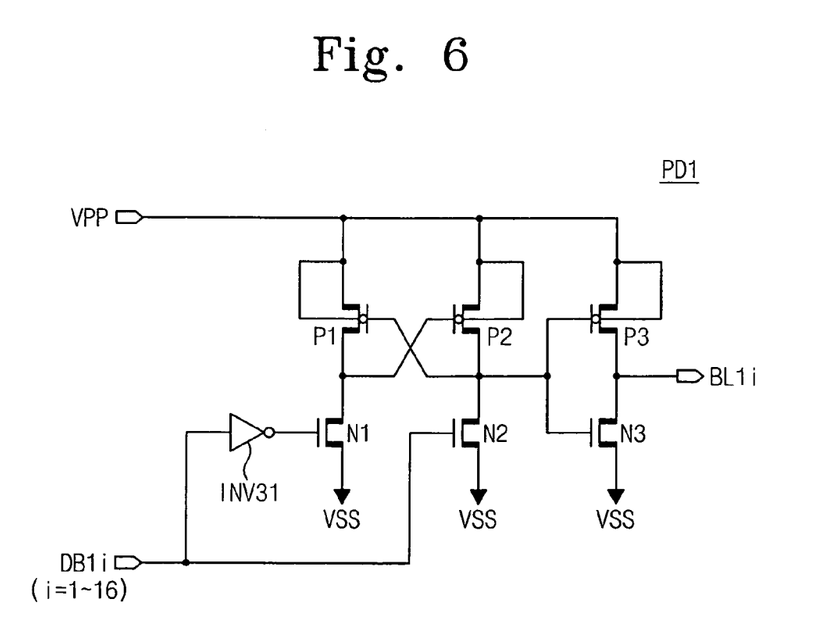
FIG. 6 is a circuit diagram illustrating the program driver shown in FIG. 3.

FIG. 6 illustrates an exemplary circuit of the program driver 30 shown in FIG. 3. Like the case of the data input buffer 20, FIG. 6 discloses the circuit of the first unit driver PD1 as a representative, but all of the n-numbered unit drivers have the same circuit feature. Further, it should be understood that FIG. 6 shows a simplified circuit although the unit driver is designed to receive the 16 program data bits DBi in parallel and connect with the 16 bitline packets BL in parallel. Therefore, the unit driver is composed of 16 units of the circuit shown in FIG. 6, the circuit elements thereof as well.

Referring to FIG. 6, the unit driver PD1 employs level shifters each formed of high-voltage PMOS and NMOS transistors P1, P2, P3, N1, N2, and N3, using the high voltage VPP (or a program voltage) as a power source. Outputs of the level shifters are each driven into the bitline packets BL1$i$. The high-voltage transistors P1~P3 and N1~N3 are designed to endure high voltage conditions. The level shifters supply the high voltage VPP or a ground voltage VSS in response to the program data bits DB1$i$ that are each applied to gates of the high-voltage NMOS transistors N1 and N2 in a complementary logic pattern by inverter INV31.

As a practical example in operation of the unit driver PD1, when one of the program data bits DQi is "1", the high-voltage NMOS transistor N2 is turned on to supply the high voltage VPP to its corresponding one of the bitline packet BL1$i$. On the other hand, when one of the program data bits DQi is "0", the high-voltage NMOS transistor N1 is turned on to supply the ground voltage VSS to its corresponding one of the bitline packet BL1$i$.

Figure 7:
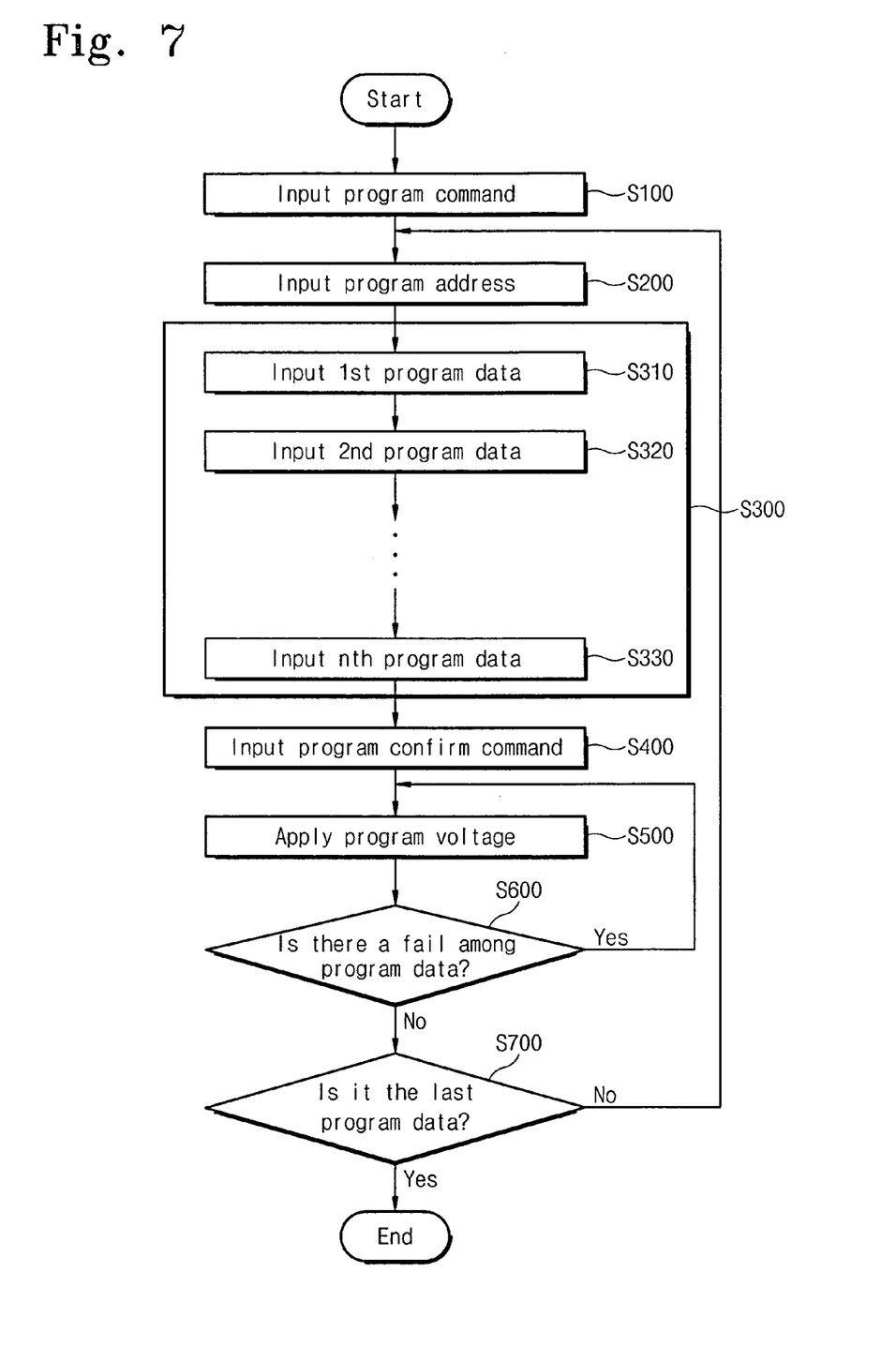
FIG. 7 is a flow chart showing a procedure of programming the NOR flash memory device.

FIG. 7 is a flow chart showing a procedure of programming the NOR flash memory device having the circuit structure shown in FIGS. 3 through 6.

Referring to FIG. 7, the first step S100 is to input a program command to enable beginning a program operation for 16 program data bits at a time.

In the second step S200, program addresses are introduced thereinto to designate locations of memory cells to store the program data bits. By means of the row and column addresses XA and YA, a wordline and 16 bitlines concordantly positioned in each bank are selected at the same time.

Afterwards, in the third step S300, units of 16 program data bits are input in sequence in a predetermined number of times and temporarily stored in the unit buffers of the data input buffer 20 in word units of 16 bits. Within the third step S300, in FIG. 7, each unit of program data bits is input, as denoted by S310, S320, and up to S330, which represents inputting the nth program data unit.

The fourth step S400 determines the number of received units of program data bits. After confirming that the number of received units of program data bits is the predetermined number (e.g., n-times until step S330), the data input operation is terminated by a program confirmation command.

Next, in the fifth step S500, the program voltage VPP is contemporaneously applied to the selected bitlines (i.e., local bitlines) in every bank in response to the program data bits that have been stored in the data input buffer 20. Meanwhile deselected bitlines in every bank are connected to the ground voltage during this program mode.

The sixth step detects whether there is a fail among the program data bits, for which the program data bits of the data input buffer 20 are compared with data bits that are written into the selected memory cells during the program operation. If there is a fail, it returns to the fifth step S500.

Finally, in the seventh step S700, it determines whether there is more data to be programmed. If there is still data to be programmed, it returns to the second step S200 to repeat the above sequence. If not, the program operation is terminated.

Even though the aforementioned embodiment describes a simultaneous programming operation for data of 16 bits, it may be available for other numbers (e.g., an integer m) of data bits to be programmed in the NOR flash memory device at the same time.

As stated above, the NOR flash memory device according to the present invention is operable in a program mode for data composed in units of bytes or words. Furthermore, this plurality of program data can be programmed at the same time after loading all sets of the program data bits in a fashion that corresponds to the number of banks arranged therein. Thus it is possible to shorten an entire program time and enhance programming efficiency.

Although the present invention has been described in connection with the embodiment of the present invention illustrated in the accompanying drawings, it is not limited thereto. It will be apparent to those skilled in the art that various substitutions, modifications, and changes may be made thereto without departing from the scope and spirit of the invention.

What is claimed is:

1. A NOR flash memory device comprising:
    a cell array including banks each composed of sectors, each sector being constructed of memory cells coupled to wordlines and bitlines;
    a row selector to designate one of the wordlines in each bank in response to a row address;
    a column selector to designate bitlines in a unit of a predetermined number in each bank in response to a column address;
    a data input buffer to receive and hold program data bits in the unit of the predetermined number or less; and
    a program driver to contemporaneously apply a program voltage to the designated bitlines in response to the program data bits held in the data input buffer.

2. The NOR flash memory device as set forth in claim 1, wherein the data input buffer is comprised of unit buffers each assigned to the banks.

3. The NOR flash memory device as set forth in claim 2, wherein each unit buffer receives the program data bits in the units of the predetermined number in parallel.

4. The NOR flash memory device as set forth in claim 1, wherein the program driver is supplied with a high voltage greater than a power source voltage to generate the program voltage.

5. The NOR flash memory device as set forth in claim 4, wherein the program driver supplies the program voltage from the high voltage or a ground voltage in response to the program data bits.

6. The NOR flash memory device as set forth in claim 2, wherein the program driver is comprised of unit drivers each assigned to the banks.

7. The NOR flash memory device as set forth in claim 1, wherein the predetermined number is 16.

8. The NOR flash memory device as set forth in claim 1, further comprising a fail detector to compare data bits of the cell array with the program data bits of the data input buffer.

9. The NOR flash memory device as set forth in claim 8, wherein the fail detector is shared by all of the banks.

10. The NOR flash memory device as set forth in claim 1, wherein the bitlines are constructed of local bitlines connected to the memory cells, and global bitlines connected to the local bitlines.

11. A system comprising:
    a host to generate data bits in units of a first predetermined number in a second predetermined number of times or less; and
    a NOR flash memory device operable in a program mode with the data bits supplied from the host, comprising:
        a cell array including banks disposed in correspondence with the second predetermined number of times, each bank being composed of sectors, each sector being constructed of memory cells coupled to wordlines and bitlines;
        a row selector to designate one of the wordlines in each bank in response to a row address;
        a column selector to designate bitlines in units of the first predetermined number in each bank in response to a column address;
        a data input buffer to receive and hold the data bits in the units of the first predetermined number in the second predetermined number of times or less; and
        a program driver to contemporaneously apply a program voltage to the designated bitlines in response to the data bits held in the data input buffer.

12. The system as set forth in claim 11, wherein the program driver is supplied with a high voltage greater than a power source voltage from the host.

13. The system as set forth in claim 11, further comprising a fail detector to compare data bits of the cell array with the data bits of the data input buffer.

14. The system as set forth in claim 13, wherein the fail detector is shared by all of the banks.

15. The system as set forth in claim 11, wherein the first predetermined number is 16.

16. A method of programming a NOR flash memory device including a cell array with a number n banks each composed of sectors each of which is constructed of memory cells coupled to wordlines and bitlines, a row selector for designating one of the wordlines in each bank in response to a row address, and a column selector for designating units of i bitlines in each bank in response to a column address, the method comprising:
    receiving a command to enable a program operation of i data bits at the same time;
    receiving addresses to designate locations to store the data bits;
    receiving and temporarily holding the i data bits an n number of times or less, corresponding to the designated bitlines; and
    simultaneously applying a program voltage to the designated bitlines in response to the data bits temporarily held.

17. The method as set forth in claim 16, further comprising, prior to receiving the command, segmenting entire program data into units of n banks and supplying the i data bits n times or less.

18. The method as set forth in claim 16, further comprising comparing data bits of the cell array with data bits of a data input buffer and detecting a fail of programming.

19. The method as set forth in claim 18, further comprising repeating applying the program voltage and comparing the data bits of the cell array until the data bits of the cell array are identical to the data bits temporarily held.

20. The method as set forth in claim 16, wherein the command to enable the program operation of the i data bits includes receiving the i data bits in parallel.

21. The method as set forth in claim 16, wherein simultaneously applying a program voltage includes applying the program voltage to the selected bitlines by receiving an external high voltage that is greater than a power source voltage.

22. The method as set forth in claim 21, wherein simultaneously applying a program voltage includes supplying the high voltage to the designated bitlines as the program voltage when the data bits are "0", and supplies a ground voltage to deselected bitlines when the data bits are "1".

23. The method as set forth in claim 16, wherein i is 16.

24. A NOR flash memory device comprising:
   a cell array including banks each composed of sectors, each sector being constructed of memory cells coupled to wordlines and bitlines;
   a row selector to designate one of the wordlines in each bank in response to a row address, the row selector including one row decoder for each one of the sectors;
   a column selector to designate bitlines in a unit of a predetermined number in each bank in response to a column address, the column selector including one column decoder for each one of the sectors;
   a data input buffer to receive and hold program data bits in the unit of the predetermined number or less; and
   a program driver to contemporaneously apply a program voltage to the designated bitlines in response to the program data bits held in the data input buffer.

25. The NOR flash memory device as set forth in claim 24, wherein the row decoder and the column decoder are grouped in a pair to correspond to one of the sectors.

26. The NOR flash memory device as set forth in claim 25, wherein the column selector includes a global column decoder corresponding to each one of the banks.

* * * * *